United States Patent [19]
Foster

[11] 3,973,109
[45] Aug. 3, 1976

[54] NULL MONITORING SYSTEM
[75] Inventor: Colin E. Foster, Bensenville, Ill.
[73] Assignee: Sanitary Scale Company, Belvidere, Ill.
[22] Filed: Mar. 17, 1975
[21] Appl. No.: 559,268

[52] U.S. Cl. .................. 235/151.33; 177/DIG. 6
[51] Int. Cl.² ................ G06F 15/20; G01G 23/10
[58] Field of Search ............... 235/151.33, 92 GC; 177/DIG. 3, DIG. 6; 340/347 P

[56] References Cited
UNITED STATES PATENTS

| | | | |
|---|---|---|---|
| 3,371,335 | 2/1968 | Seewald | 235/92 GC |
| 3,403,392 | 9/1968 | Wogatzke | 235/92 GC |
| 3,713,139 | 1/1973 | Sanford et al. | 235/92 GC |
| 3,740,536 | 6/1973 | Takahashi et al. | 235/151.33 |
| 3,805,907 | 4/1974 | Knothe et al. | 177/DIG. 6 |
| 3,826,318 | 7/1974 | Baumgartner | 177/DIG. 6 |

Primary Examiner—Jerry Smith
Attorney, Agent, or Firm—Richard O. Gray, Jr.

[57] ABSTRACT

The disclosure relates to a null monitoring system for a digital incremental scale of the type including a weighing platform and a reticle assembly which provides first and second sinusoidal outputs 90° out of phase for deriving counting pulses indicative of the weight of the load and the weighing platform position accurate to a single digital increment of the scale and the direction of movement of the weighing platform. The null monitoring system provides an analog indication of the actual position of the weighing platform within the digital increments for zero reference and calibration purposes.

The null monitoring system includes combining means for combining the first and second sinusoidal outputs for providing first, second, third and fourth combined sinusoidal outputs, each having a 90° quadrant with an instantaneous magnitude indicative of the position of the weighing platform within the digital increments, monitoring means for monitoring the magnitudes of the combined sinusoidal outputs, and counting means responsive to the counting pulses for selecting individual ones of the combined sinusoidal outputs during 90° quadrants thereof to be monitored by the monitoring means.

14 Claims, 10 Drawing Figures

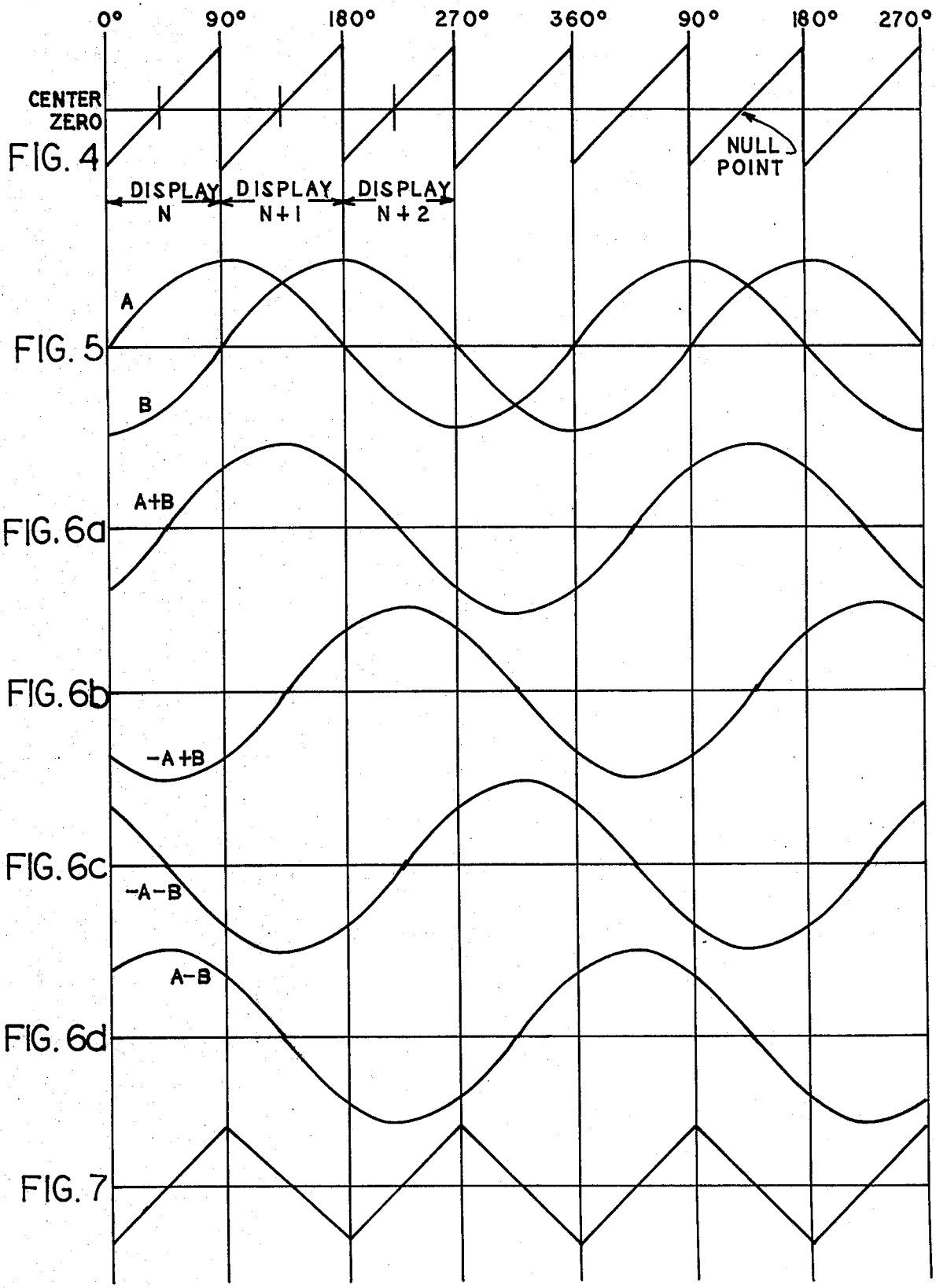

NULL MONITORING SYSTEM

BACKGROUND OF THE INVENTION

The present invention relates to a null monitoring system and more particularly to a null monitoring system for digital incremental scales.

It is desirable in any commercial weighing operation, but particularly in retail food operations, that strict accuracy and equity be maintained. Consumers are concerned that they receive full weight and value. Merchants wish to avoid embarrassment and possible prosecution for short weight but yet must be assured of full legitimate profit to survive. Analog weighing devices as heretofore used in the retail trade did provide through analog indices and means at least for virtual absolute zero resolution and definitive full range calibration. In recent digital devices without supplementary analog provision or other means, neither reference zero nor calibration over the weighing range can readily be resolved to less than plus or minus one-half of the minimum weight which is digitally indicated or recorded. Since net profit in retail operations today may sometimes not exceed one-half of 1%, a minus resolution error of that order may totally or substantially offset minimal and dissipated profits, or result in short weight publicity and prosecution. The monitoring system of the present invention heredisclosed is a novel and unique means for absolute resolution at zero and for the purpose of definitive calibration through the weighing range and yet permits the use of relatively inexpensive low-resolution encoders. The monitoring system of the present invention is particularly valuable for use in conjunction with simple functional in-store check procedures insuring better than regulatory or common maintenance tolerances in use and as incorporated in several of assignee's present digital devices.

One form of digital scale utilizes a weighing platform and a reticle assembly including one or more light sources and light sensors and a displaceable reticle which is mechanically linked to the weighing platform for displacement proportional to the weighing platform displacement and ultimately to the weight of the load being weighed. Such reticles include light transmissive areas and opaque areas and cooperate with the light sources and light sensors to derive a plurality of counting pulses. When a load is placed onto the weighing platform, the scale weighing platform moves up and down in oscillating movement to cause the reticle assembly to provide the counting pulses. As the weighing platform moves in the down direction the counting pulses are added and as the weighing platform moves in the up direction the counting pulses are subtracted to ultimately obtain a net number of pulses when the weighing platform comes to rest.

Because the counting pulses are generated digitally, the position of the weighing platform can only be determined to within the least significant digit of the scale. For calibration purposes, it would be advantageous to determine the exact position of the weighing platform within the scale least significant digit.

It is therefore an object of the present invention to provide a null monitoring system for a digital scale for monitoring the exact position of the scale weighing platform within the scale least significant digit.

It is also an object of the present invention to provide a null monitoring system which generates an analog signal the magnitude of which is indicative of the scale weighing platform position within the scale least significant digit increment.

It is a still further object of the present invention to provide a null monitoring system which provides means for determining the exact position of the digital scale weighing platform within its least significant digit when the platform comes to rest.

SUMMARY OF THE INVENTION

The invention provides a null monitoring system for use in a digital incremental scale of the type which includes a weighing platform, a reticle assembly comprising a reticle having a plurality of light transmissive areas and opaque areas and displaceable by an amount proportional to the weighing platform load, a light source on one side of the reticle, and first and second light sensors on the other side of the reticle, the first and second light sensors being aligned in relation to the light source for operation with the light transmissive areas and the opaque areas and being spaced apart by approximately one-fourth the distance between adjacent light transmissive areas to generate first and second sinusoidal outputs which are approximately 90° out of phase with one another to thereby derive four counting pulses as the reticle is displaced by a distance equal to the distance between adjacent transmissive areas for indicating the extent and direction of reticle displacement accurate to a single digital increment of the scale. The null monitoring system monitors the position of the scale weighing platform within the digital increments and comprises combining means coupled to the first and second light sensors for combining the first and second sinusoidal outputs for providing first, second, third and fourth combined sinusoidal outputs, each of the combined sinusoidal outputs having a 90° quadrant the magnitude of which is indicative of the position of the scale weighing platform within the digital increments, monitoring means coupled to the combining means for monitoring the magnitude of the first, second, third and fourth combined sinusoidal outputs, and counting means coupled to the combining means and responsive to the counting pulses for acting upon the combining means to select individual ones of the first, second, third and fourth combined sinusoidal outputs during 90° quadrants thereof one at a time to derive an analog signal indicative of the instantaneous position of the weighing platform within the digital increments to be monitored by the monitoring means.

BRIEF DESCRIPTION OF THE DRAWINGS

The invention, together with the objects and advantages thereof, may best be understood by reference to the following description taken in conjunction with the accompanying drawings, and the several figures of which like reference numerals identify like elements, and in which:

FIG. 4 is a graphical representation of an ideal waveform to be utilized by the null monitoring means of the present invention;

FIG. 5 shows graphical representations of the sinusoidal outputs provided by the reticle assembly of FIG. 1 which may be utilized in practicing the present invention;

FIGS. 6a–6d are graphical representations of combined sinusoidal outputs resulting from the combination of the sinusoidal outputs of FIG. 5 which are utilized by the null monitoring means of the present invention; and FIG. 7 is a graphical representation of another waveform obtainable in accordance with an alternate embodiment of the present invention.

DESCRIPTION OF THE PREFERRED EMBODIMENT

Figure 1:
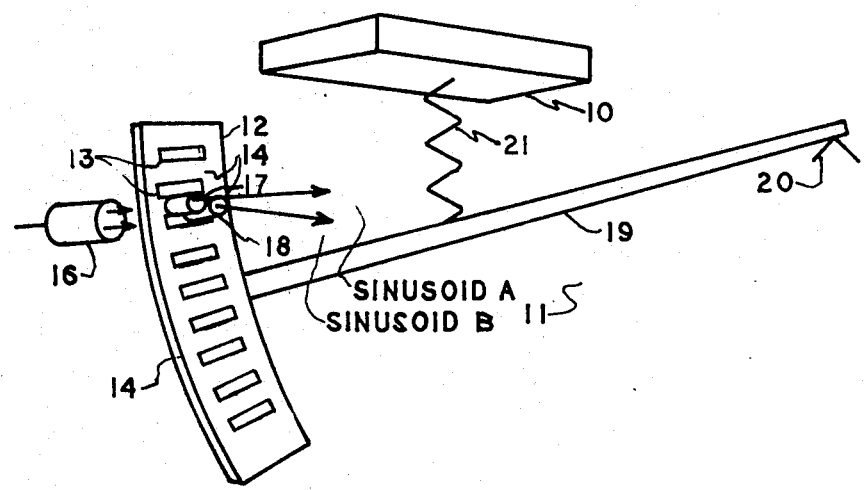
FIG. 1 is a perspective view showing the weighing platform and reticle assembly of a digital scale which may be utilized in practicing the present invention.

Referring now to FIG. 1, there is shown a perspective representation of a weighing platform 10 and reticle assembly 11 of a digital scale which may be utilized in practicing the present invention. The reticle assembly 11 comprises a reticle 12 having a plurality of light transmissive areas 13, a plurality of light opaque areas 14, a light source 16 and first and second sensors 17 and 18 on the side of the reticle opposite the light source. The reticle assembly has lever arm 19 pivotally mounted at point 20 to impart arcuate movement or displacement to the reticle 12. The lever arm 19 is coupled to the weighing platform 10 by linkage 21 to thereby displace the reticle by an amount proportional to the displacement of the weighing platform and ultimately the weight of the load placed onto the weighing platform.

Sensors 17 and 18 are aligned relative to the light transmissive and opaque areas and to the light source 16 to provide first and second outputs which approximate sinusoids, sinusoid A and sinusoid B. While sinusoids A and B are not true sinusoids, they are close enough to being truly sinusoidal for purposes of this preferred embodiment to be considered as such. Therefore, they and any other signals derived from their combination will hereinafter be referred to as sinusoids. Sinusoid A is generated by light sensor 17 and sinusoid B is generated by light sensor 18. The light sensors are spaced apart by one-fourth the distance between adjacent transmissive areas resulting in sinusoid A and sinusoid B being 90° out of phase with each other. Sinusoid A and sinusoid B are graphically shown in FIG. 5.

Figure 2:
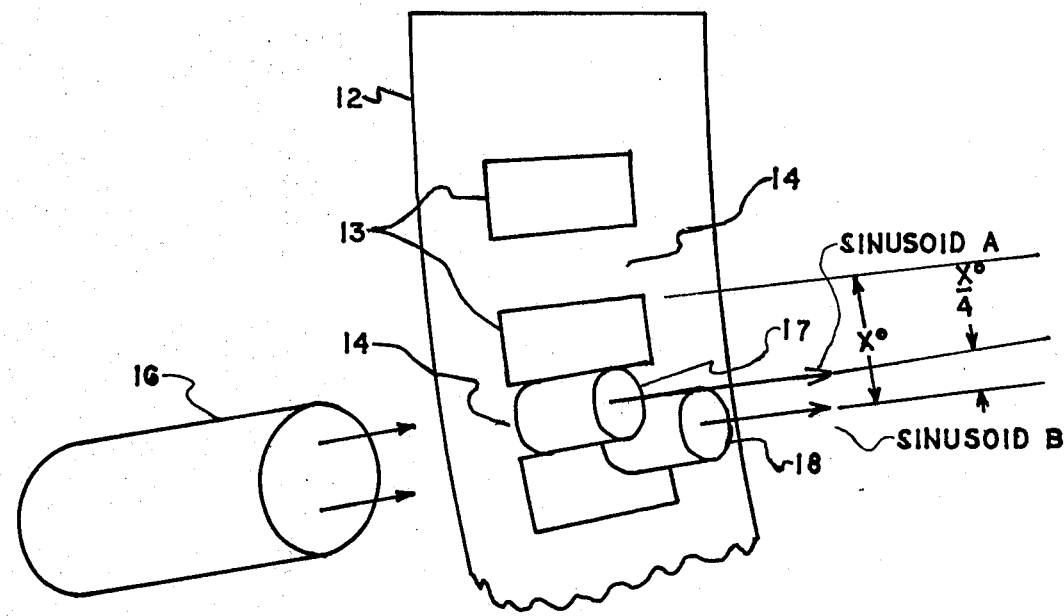
FIG. 2 is an exploded partial view of the reticle assembly of FIG. 1.

FIG. 2 shows the reticle and associated light source and light sensors in greater detail. The light transmissive areas and opaque areas are of a width which approximates the relative magnitude of the diameters of the light sensors. This assures that the outputs of the light sensors are a close approximation to a sinusoidal signal.

Figure 3:
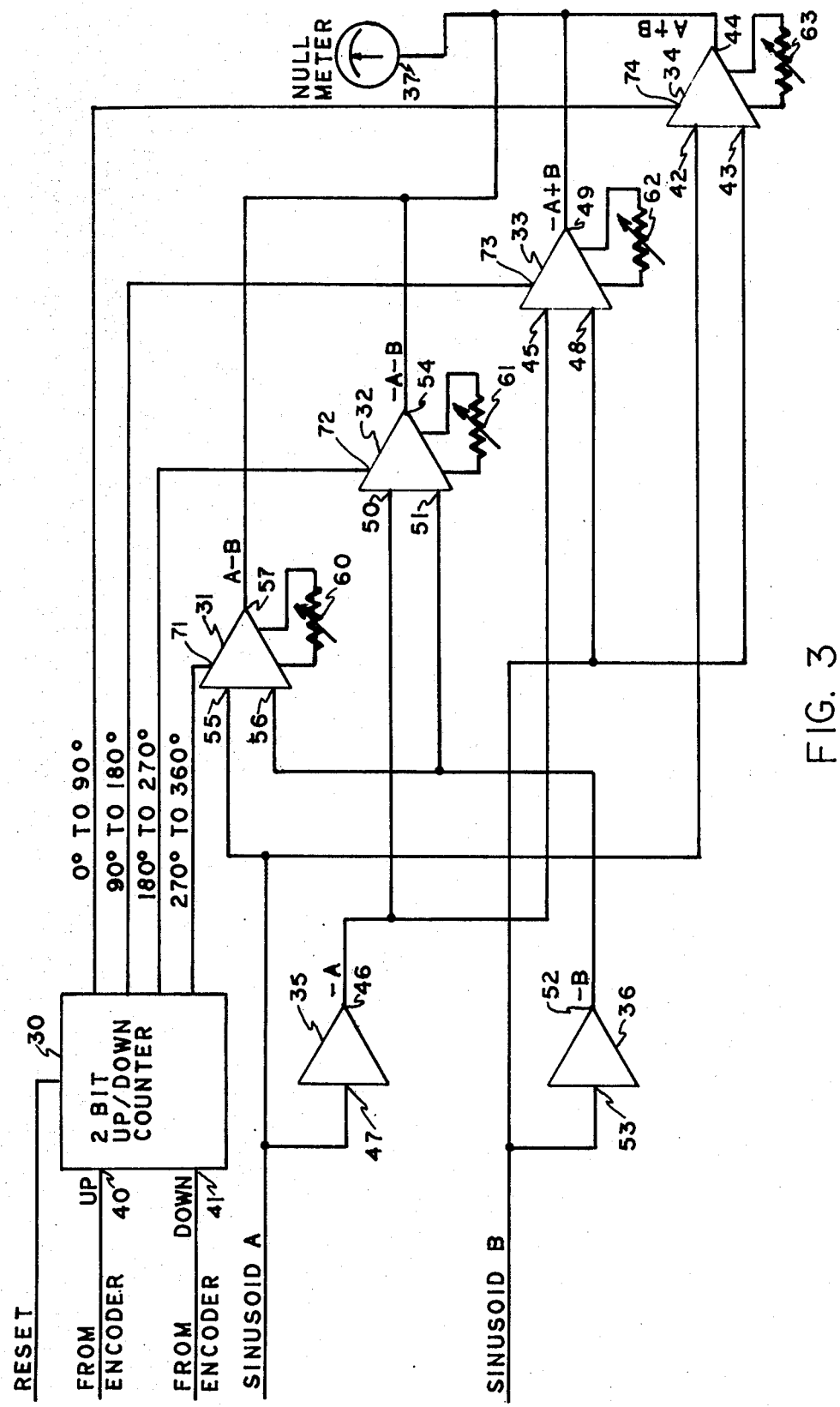
FIG. 3 is a schematic circuit diagram of a null monitoring system embodying the present invention.

Referring now to FIG. 3, there is shown a circuit diagram partially in block form of a null monitoring system embodying the present invention. It comprises a two-bit up/down counter 30, operational amplifiers 31–34, inverting amplifiers 35 and 36, and a null monitor comprising a null volt meter 37.

The two-bit up/down counter 30 is of the type well known in the art and has a pair of inputs 40 and 41 which are coupled to the encoder interface of the digital scale which provides up counting pulses at input 40 and down counting pulses at input 41. Referring to FIG. 5 for a moment, FIG. 5 shows the sinusoidal output A of sensor 17 and the sinusoidal output B of sensor 18 as the reticle moves. The encoder interface includes a threshold detector and transforms the sinusoidal outputs to square waves which are then examined by the encoder interface to generate a counting pulse whenever one of the square waves makes a transition. Logic within the encoder interface determines from the condition of the square waves at any point in time along with the particular transition monitored to determine if the reticle is moving in the upward or downward direction. If a transition occurs and the reticle is moving in the downward direction the encoder will provide an up pulse and if the reticle is moving in the upward direction the encoder will provide a down pulse. Because the sinusoidal outputs are 90° out of phase, as the reticle is displaced by a distance equal to the distance between adjacent transmissive areas four counting pulses will be provided. This is commonly referred to as four-times logic and is well known in the art. A reset pulse is applied at the start of the reticle movement to synchronize the two-bit counter with the sinusoidal signals so that the first count corresponds to the 0° to 90° quadrant, the second corresponds to 90° to 180° etc.

Referring back to FIG. 3, operational amplifiers 31, 32, 33 and 34 and inverting amplifiers 35 and 36 comprise a combining means wherein the sinusoidal outputs are combined to provide first, second, third and fourth combined sinusoidal outputs. Operational amplifier 34 has an input 42 coupled to light sensor 17 for receiving sinusoid A and input 43 coupled to light sensor 18 for receiving sinusoid B. Operational amplifier 34 adds sinusoid A to sinusoid B and provides an output at output 44 which comprises the combination of sinusoid A and B. This is the first combined sinusoidal output and is graphically illustrated in FIG. 6a and is labeled A+B.

Operational amplifier 33 has an input 45 coupled to output 46 of inverting amplifier 35 is coupled to light sensor 17 and provides at output 46 a signal which is the inversion of sinusoid A and provides the inverted sinusoid A at input 45 of operational amplifier 35. Operational amplifier 33 also has input 48 coupled to the light sensor 18 for receiving sinusoid B. Therefore, operational amplifier 33 provides at output 49 the second combined sinusoidal output which comprises the summation of the inverted sinusoid A and the uninverted sinusoid B. The second combined sinusoidal output is graphically illustrated in FIG. 6b and is labeled −A+B.

Operational amplifier 32 has an input 50 coupled to output 46 of inverting amplifier 35 to receive the inverted sinusoid A. Operational amplifier 32 also has an input 51 coupled to output 52 of inverting amplifier 36. Inverting amplifier 36 has an input 53 coupled to light sensor 18 for providing at output 52 the inversion of sinusoid B. Operational amplifier 32 has at its inputs 50 and 51 the inverted sinusoid A and inverted sinusoid B respectively to provide at output 54 the third combined sinusoidal output which comprises the difference between the inverted sinusoid A and the inverted sinusoid B. It is graphically illustrated in FIG. 6c and is labeled −A−B.

Lastly, operational amplifier 31 has an input 55 coupled to light sensor 17 for receiving sinusoid A and an input 56 coupled to output 52 of inverting amplifier 36 for receiving the inverted sinusoid B. Operational amplifier 31 therefore provides at output 57 the fourth combined sinusoidal output which comprises the difference between the sinusoid A and the inverted sinusoid B. It is graphically illustrated in FIG. 6d and is labeled A−B.

Null meter 37 is coupled to each of the operational amplifier outputs 57, 54, 49 and 44 for receiving the combined sinusoidal outputs. Each of the operational amplifiers 31, 32, 33 and 34 is coupled to the two-bit up/down counter which selects the operational amplifiers one at a time responsive to the counting pulses received upon its inputs 40 and 41. It receives the up pulses at input 40 and down pulses at input 41. The two-bit up/down counter derives from its input conditions, a two-bit binary word which is decoded to select one of the operational amplifiers in response to the particular two-bit binary word present as a result of counting the up and down input pulses. In practicing the present invention, counter 30 preferably may include a 7473 integrated circuit and 7400 quad two-input gate arranged in a well known fashion to form a binary up/down counter. For decoding the binary words thereby produced, counter 30 may preferably include a 2405 Harris Semiconductor decoder integrated circuit which accepts the two-bit binary words, decodes them, and provides a signal at one of the four outputs of counter 30. Which output provides the signal is dependent upon the logic levels of the two bits within the counter. The 2405 integrated circuit is particularly suited for practicing the present invention because it includes operational amplifiers which may be used for operational amplifiers 31, 32, 33 and 34. All of these integrated circuits are commercially available and their applications are well known. Also, inasmuch as two-bit up/down counters and one of four decoders are well known in the art, their functions have been combined in counter 30 as shown in FIG. 3 for purposes of simplicity. Each of the operational amplifiers 31, 32, 33 and 34 includes a power input enable gate 71, 72, 73 and 74 respectively and is selected by being coupled to its power supply voltage by its gate responsive to signals from the two-bit up/down counter 30. When it is activated, it provides the null meter with its respective combined sinusoidal output 90° quadrant which is indicative of the position of the weighing platform within the scale least significant digit.

Referring now to the graphical illustration of FIG. 4, it shows the ideal waveform which may be provided to the null meter 37. Within each significant digit of the weighing scale, the waveform of FIG. 4 provides an analog signal which is representative of the position of the weighing platform at any instant of time within the scale least significant digit. In other words, because the scale is digital and therefore must derive the weight of an item by counting individual and discrete digital increments of weight (i.e. .01 pb. increments), an individual increment can only be added or subtracted after the weighing platform has physically passed by a transition point. The waveform of FIG. 4 allows the instantaneous position of the platform between increments and thus between transition points to be determined. For ease of interpretation, the null meter should ideally have its null point in the center of its scale and move from left to right with increasing weight. Thus, readings to the left of the null would correspond to a weight just less than the displayed weight and readings to the right of the null will indicate a weight greater than the displayed weight but all within one count of the least significant increment of the digital display. Observation will show that the ideal waveform of FIG. 4 can be constructed by selecting individual 90° quadrants of the combined sinusoidal outputs which correspond to individual 90° quadrants of sinusoid A. For example, the first combined sinusoidal output (A+B) between the 0° to 90° quadrant of sinusoid A corresponds to the desired signal for the null meter. Similarly, the second, third and fourth combined sinusoidal outputs satisfy the null meter waveform requirements between 90°–180°, 180°–270° and 270°–360° quadrants respectively of sinusoid A. The output signals from counter 30 sequentially enable one of the amplifiers in the previously described operational sequence for providing the null meter with an analog signal indicative of the position of the weighing platform within its least significant digit. A reset pulse is applied at the start of the reticle movement to synchronize the two-bit counter with the sinusoidal signals so that the first count corresponds to the 0° to 90° quadrants, the second to 90° to 180° etc.

Practice has shown that as the weighing platform comes to rest the null meter needle will jump rapidly as it tracks the combined sinusoidal outputs. This effect can be minimized by damping the meter to lower its response. Alternately the sequence of selection can be altered by rearranging the connections between the counter and the amplifiers to operate in the sequence A+B, A−B, −A−B, −A+B. This produces a waveform without discontinuities but in the direction of the waveform fed to null meter 37 for the even numbered signals, i.e. from 90° to 180° and 270° to 360°, is reversed as shown in FIG. 7.

A still further modification may be made which includes a two position switch, where in one position of the switch the null monitoring system is operative for all positions of the weighing platform and in the other position, the null monitoring system is operative for only the zero weight or unloaded position of the weighing platform. For the first switch position the null monitoring system may be operated in accordance with any of the embodiments previously described. The second switch position may be used to activate a gate associated with a separate zero reference sensor and light transmissive area for deactivating all of the operational amplifiers when the scale weighing platform is displaced away from the zero reference position. With this modification, the scale operator need only be concerned with absolute zero while a service technician would have means affording exact calibration for all weighing platform positions.

While particular embodiments of the invention have been shown and described, modifications may be made, and it is intended in the appended claims to cover all such modifications as may fall within the true spirit and scope of the invention.

I claim:

1. In a digital incremental scale of the type which includes a weighing platform, a reticle assembly comprising a reticle having a plurality of light transmissive areas and opaque areas and displaceable by an amount proportional to the weighing platform load, a light source on one side of the reticle, and first and second light sensors on the other side of the reticle, said first and second light sensors being aligned in relation to the light source for operation with said light transmissive areas and said opaque areas and being spaced apart by approximately one-fourth the distance between adjacent light transmissive areas to generate first and second sinusoidal outputs which are approximately 90° out of phase with one another to thereby derive four counting pulses as said reticle is displaced by a distance equal to the distance between adjacent transmissive areas for indicating the extent and direction of reticle displacement accurate to a signal digital increment of the scale, a null monitoring system for monitoring the position of the scale weighing platform within the digital increments comprising:

combining means coupled to said first and second light sensors for combining said first and second sinusoidal outputs for providing first, second, third and fourth combined sinusoidal outputs, each of said combined sinusoidal outputs having a 90° quadrant, the instantaneous magnitude of which is indicative of the position of the scale weighing platform within the digital increments;

counting means coupled to said combining means and responsive to said counting pulses for acting upon said combining means to select individual ones of said first, second, third and fourth combined sinusoidal outputs during 90° quadrants thereof one at a time to thereby derive an analog signal indicative of the instantaneous position of the weighing platform within the digital increments; and monitoring means coupled to said combining means for monitoring said selected 90° quadrants of said first, second, third and fourth combined sinusoidal outputs and for providing an analog indication of the instantaneous position of the weighing platform within the digital increments of the scale.

2. A null monitoring system in accordance with claim 1 wherein said monitoring means comprises a voltmeter for providing a visual indication of the magnitudes of said first, second, third, and fourth combined sinusoidal outputs.

3. A null monitoring system in accordance with claim 1 wherein said combining means comprises a first, second, third and fourth operational amplifier for combining said first and second sinusoidal outputs for providing said first, second, third and fourth combined sinusoidal outputs respectively.

4. A null monitoring system in accordance with claim 3 wherein said combining means further comprises a first inverting amplifier and a second inverting amplifier, said first inverting amplifier being coupled to said first sensor for providing an inverted first sinusoidal output and said second inverting amplifier being coupled to said second sensor for providing an inverted second sinusoidal output.

5. A null monitoring system in accordance with claim 1 wherein said first operational amplifier comprises first and second inputs, said first input being coupled to said first light sensor and said second input being coupled to said second light sensor for providing said first combined sinusoidal output comprising the summation of the first and second sinusoidal outputs.

6. A null monitoring system in accordance with claim 5 wherein said counting means selects said first combined sinusoidal output during the 0° to 90° quadrant of said first sinusoidal output.

7. A null monitoring system in accordance with claim 4 wherein said second operational amplifier comprises first and second inputs, said first input being coupled to said first inverting amplifier and said second input being coupled to said second light sensor for providing said second combined sinusoidal output which comprises the summation of the inverted first sinusoidal output and the second sinusoidal output.

8. A null monitoring system in accordance with claim 7 wherein said counting means selects said second combined sinusoidal output during the 90° to 180° quadrant of said first sinusoidal output.

9. A null monitoring system in accordance with claim 7 wherein said counting means selects said second combined sinusoidal output during the 270° to 360° quadrant of said first sinusoidal output.

10. A null monitoring system in accordance with claim 4 wherein said third operational amplifier comprises first and second inputs, said first input being coupled to said first inverting amplifier and said second input being coupled to said second inverting amplifier for providing said third combined sinusoidal output which comprises the difference between the inverted first sinusoidal output and the second inverted sinusoidal output.

11. A null monitoring system in accordance with claim 10 wherein said counting means selects said third combined sinusoidal output during the 180° to 270° quadrant of said first sinusoidal output.

12. A null monitoring system in accordance with claim 4 wherein said fourth operational amplifier comprises first and second inputs, said first input being coupled to said first light sensor and said second input being coupled to said second inverting amplifier for providing said fourth combined sinusoidal output which comprises the difference between the first sinusoidal output and the inverted second sinusoidal output.

13. A null monitoring system in accordance with claim 12 wherein said counting means selects said fourth combined sinusoidal output during the 270° to 360° quadrant of said first sinusoidal output.

14. A null monitoring system in accordance with claim 12 wherein said counting means selects said fourth combined sinusoidal output during the 90° to 180° quadrant of said first sinusoidal output.

* * * * *